United States Patent
Jeong et al.

(10) Patent No.: US 10,884,047 B2
(45) Date of Patent: Jan. 5, 2021

(54) PROBE SOCKET

(71) Applicant: LEENO INDUSTRIAL INC., Busan (KR)

(72) Inventors: Jae-hwan Jeong, Busan (KR); Geun-su Kim, Busan (KR); Jung-chul Shin, Changwon-si (KR)

(73) Assignee: LEENO INDUSTRIAL INC.

( * ) Notice: Subject to any disclaimer, the term of this patent is extended or adjusted under 35 U.S.C. 154(b) by 302 days.

(21) Appl. No.: 15/916,479

(22) Filed: Mar. 9, 2018

(65) Prior Publication Data
US 2018/0196096 A1 Jul. 12, 2018

Related U.S. Application Data

(63) Continuation of application No. PCT/KR2016/010077, filed on Sep. 8, 2016.

(30) Foreign Application Priority Data

Sep. 10, 2015 (KR) .................. 10-2015-0128114

(51) Int. Cl.
*G01R 29/08* (2006.01)
*G01R 1/04* (2006.01)
*G01R 1/073* (2006.01)

(52) U.S. Cl.
CPC ......... *G01R 29/0835* (2013.01); *G01R 1/045* (2013.01); *G01R 1/0466* (2013.01); *G01R 1/0491* (2013.01); *G01R 1/07328* (2013.01)

(58) Field of Classification Search
None
See application file for complete search history.

(56) References Cited

U.S. PATENT DOCUMENTS 4,603,023 A * 7/1986 Mack ................. G01R 1/06783
264/135

FOREIGN PATENT DOCUMENTS

JP          5193200 B2    5/2013
KR   10-2006-0052285 A    5/2006
(Continued)

OTHER PUBLICATIONS

Korean Office Action (KR 10-2015-0128114), KIPO, dated Dec. 14, 2016.
(Continued)

*Primary Examiner* — Jas A Sanghera
(74) *Attorney, Agent, or Firm* — Park & Associates IP Law, P.C.

(57) ABSTRACT

The radio frequency (RF) probe socket is disclosed. The probe socket includes a conductive noise shielding body configured to accommodate the plurality of signal probes to be parallel with one another while exposing opposite ends thereof, and shield noise; upper and lower noise shielding walls configured to be extended from the noise shielding body to some areas between the exposed opposite ends of the plurality of signal probes; and upper and lower holding members configured to be arranged on top and bottom sides of the noise shielding body, support the exposed opposite ends of the plurality of signal probes, and comprise accommodating grooves accommodate the noise shielding walls, respectively. With this, the noise shielding wall extended from the shielding block makes a shield between the signal probe pins passing through the upper and lower holding member, thereby preventing crosstalk between the signal probe pins.

5 Claims, 7 Drawing Sheets

(56) References Cited

FOREIGN PATENT DOCUMENTS

| | | |
|---|---|---|
| KR | 10-2010-0037431 A | 4/2010 |
| KR | 10-2014-0003713 A | 1/2014 |
| KR | 10-1534778 B1 | 7/2015 |
| KR | 10-1552552 B1 | 9/2015 |
| TW | 200624839 A | 7/2006 |
| TW | 200902985 A | 1/2009 |
| WO | WO-2009001731 A1 * 12/2008 | ......... G01R 1/07371 |

OTHER PUBLICATIONS

International Search Report (PCT/KR2016/010077), WIPO, dated Jan. 18, 2017.
Taiwan Office Action (TW 20160129226), TIPO, dated Oct. 6, 2017.
Korean Notice of Allowance (KR 10-2015-0128114), KIPO, dated Apr. 25, 2017.

* cited by examiner

PROBE SOCKET

REFERENCE TO RELATED APPLICATIONS

This is a continuation of International Patent Application PCT/KR2016/010077 filed on Sep. 8, 2016, which designates the United States and claims priority of Korean Patent Application No. 10-2015-0128114 filed on Sep. 10, 2015, the entire contents of which are incorporated herein by reference.

FIELD OF THE INVENTION

The present invention relates to a probe socket, and more particularly to a probe socket for testing electric characteristics of a radio frequency (RF) high-speed circuit module, an integrated circuit (IC), etc. before being mounted to a circuit board.

BACKGROUND OF THE INVENTION

In general, a probe socket having a coaxial structure has been used to solve a problem that RF signal characteristics are deteriorated as noise of a digital circuit is introduced into an analog circuit when testing a device in which a ground of the analog circuit and a ground of the digital circuit are separated.

A conventional probe socket includes a conductive shielding block in which a plurality of signal probe pins are accommodated in contactless and a ground probe pin is accommodated in contact, and upper and lower holding members which are arranged on top and bottom sides of the conductive shielding block and support the signal probe pins and the ground probe pin, respectively. In this case, the upper and lower holding members are made of ceramic, and holds the signal probe pins exposed to the top and bottom sides of the shielding block.

However, the ceramic of the holding member does not shield signal noise, and therefore crosstalk occurs between the signal probe pins exposed to the top and bottom sides of the shielding block. In result, the conventional probe socket has an insertion loss, a return loss and the like low characteristic in signal transmission, and does not satisfy a characteristic of 50Ω±10% due to mismatched impedances.

Mechanically, a distance between the probe pins is 0.26 mm, which is very short, and a probe pin accommodating hole of the shielding block is 0.2 mm, which is very small. Therefore, it is very difficult to accurately align the shielding block with the upper and lower holding members. Accordingly, a process of coupling the signal probe pins and the ground probe pin to the shielding block and the upper and lower holding members is very difficult, and thus manufacturing costs increase.

SUMMARY OF THE INVENTION

An object of the present invention is to solve the foregoing problems, and provide an RF probe socket excellent in impedance matching and signal transmission characteristics.

Another object is to provide an RF probe socket in which the shielding block and the upper and lower holding members for accommodating and supporting the signal probe pins and the ground probe pin are easily aligned.

To solve the foregoing problems, there is provided a probe socket comprising: a conductive noise shielding body configured to accommodate the plurality of signal probes to be parallel with one another while exposing opposite ends thereof, and shield noise between the plurality of signal probes; upper and lower noise shielding walls configured to be extended from the noise shielding body to predetermined areas between the exposed opposite ends of the plurality of signal probes; and upper and lower holding members configured to be arranged on top and bottom sides of the noise shielding body, support the exposed opposite ends of the plurality of signal probes, and comprise accommodating grooves for accommodating the noise shielding walls, respectively.

The accommodating grooves may be configured to penetrate the upper and lower holding members.

The noise shielding body may comprise a brass block.

The noise shielding body comprises at least two noise shielding bodies to be stacked, and the probe socket further comprises an intermediate supporting member configured to support the plurality of signal pins between the stacked noise shielding bodies.

The probe socket may further comprise a plurality of ground probes, wherein the upper and lower noise shielding walls are configured to accommodate at least one of the plurality of ground probes.

The probe socket according to the present invention can prevent crosstalk between the signal probe pins since the noise shielding walls extended from the shielding block makes a shield between the signal probe pins passing through the upper and lower holding members.

Further, the shielding block can be accurately aligned with the upper and lower holding members based on the alignment between the noise shielding wall and the noise shielding wall accommodating groove.

DETAILED DESCRIPTION OF THE INVENTION

Figure 1:
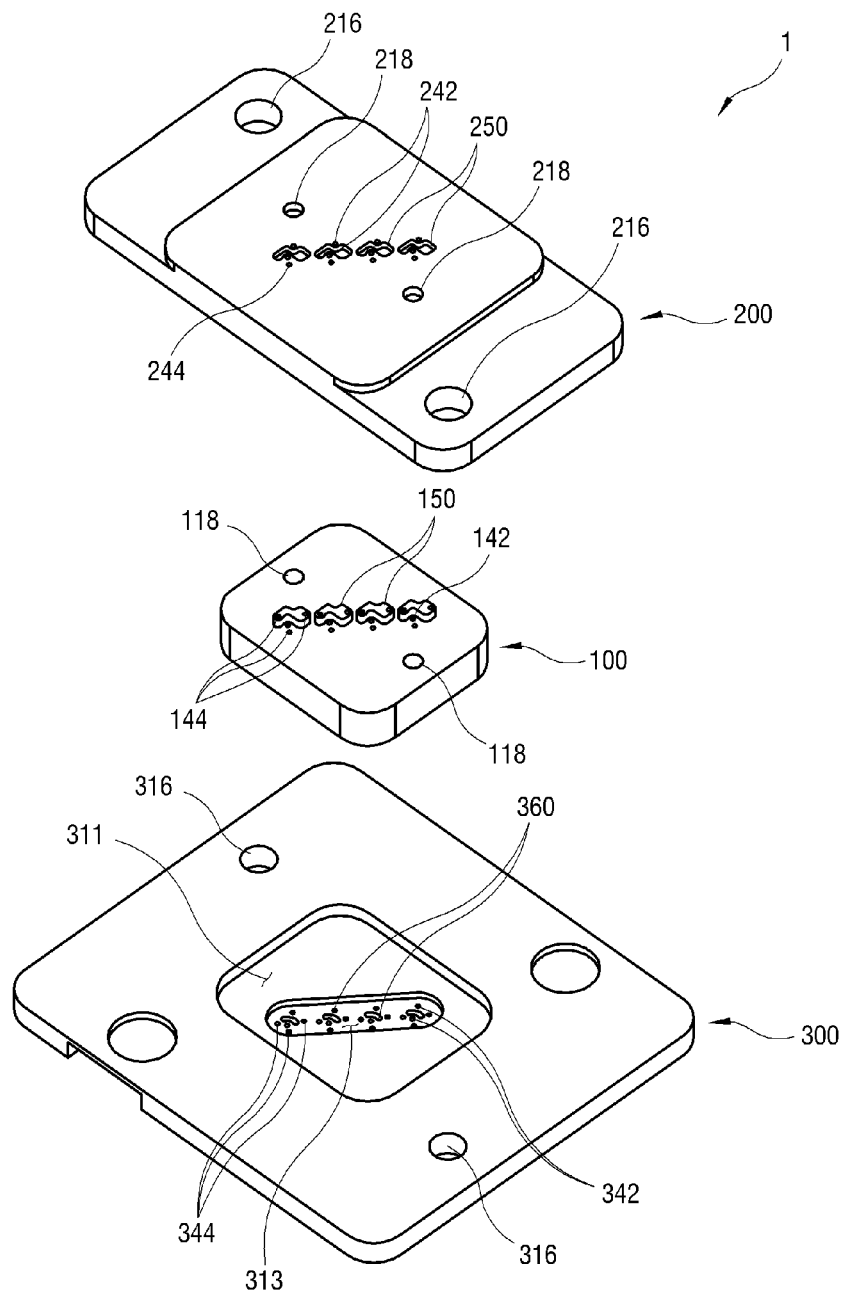
FIGS. 1 and 2 are exploded perspective views of a probe socket according to the first embodiment of the present invention.
Figure 2:
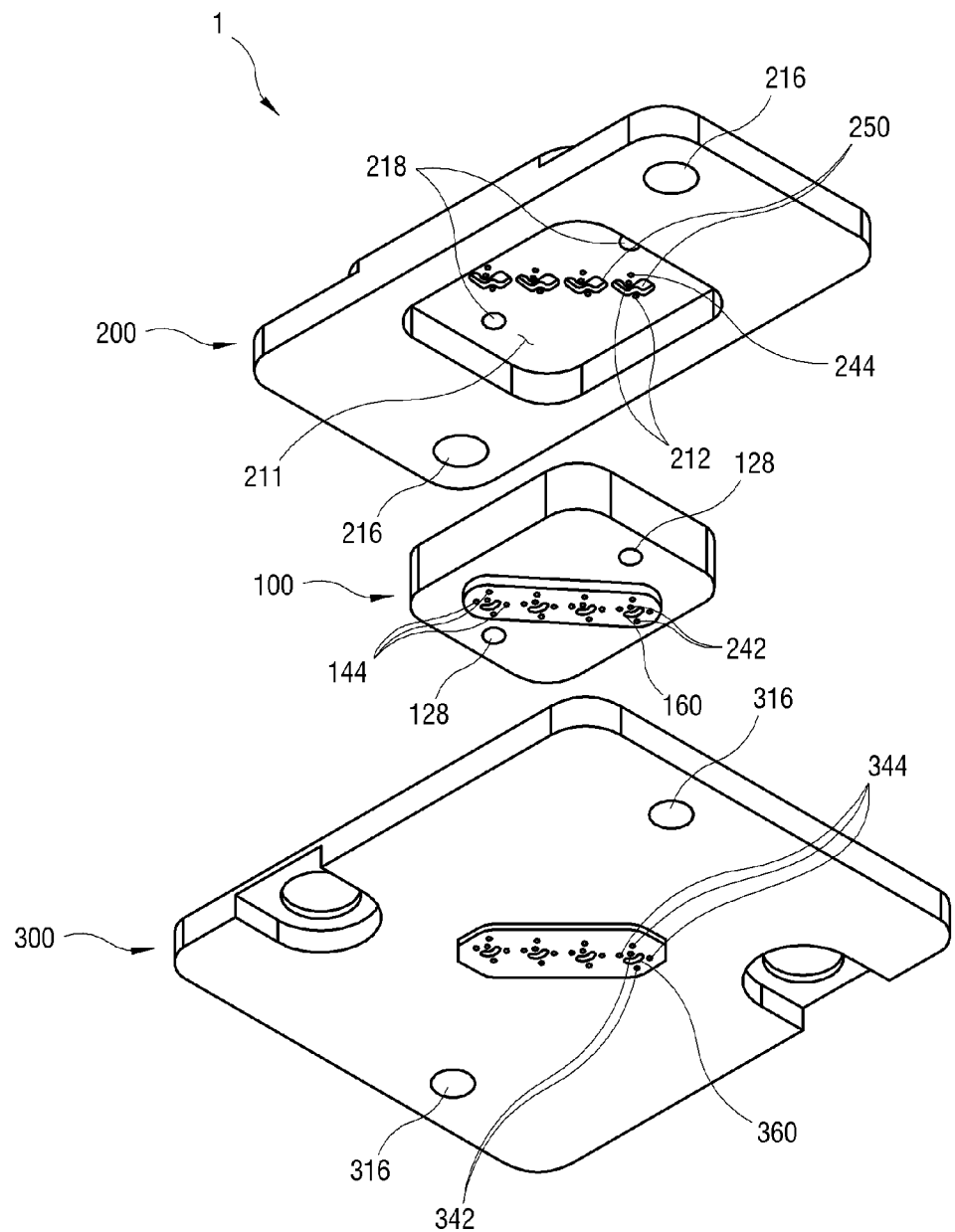

FIGS. 1 and 2 are exploded perspective views of a probe socket according to the first embodiment of the present invention. The probe socket 1 includes a noise shielding body 100, an upper holding member 200, and a lower holding member 300. The noise shielding body 100 is interposed and arranged between a bottom groove 211 of the upper holding member 200 and a top groove 311 of the lower holding member 300.

Figure 3:
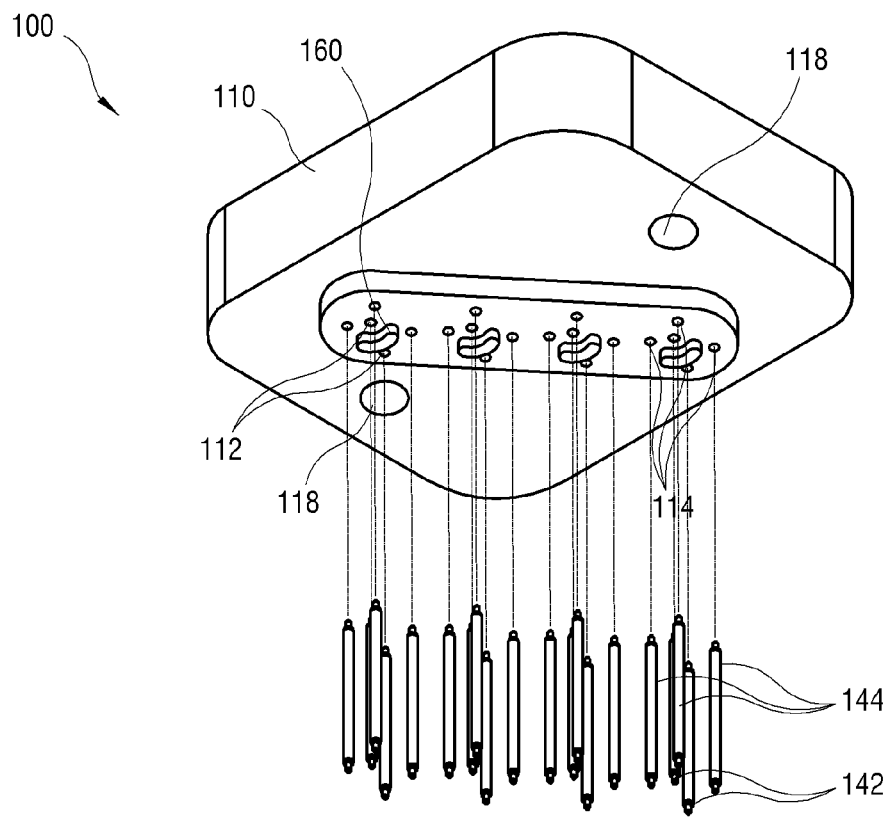
FIG. 3 is an exploded perspective view of a noise shielding body in FIG. 1.
Figure 5:
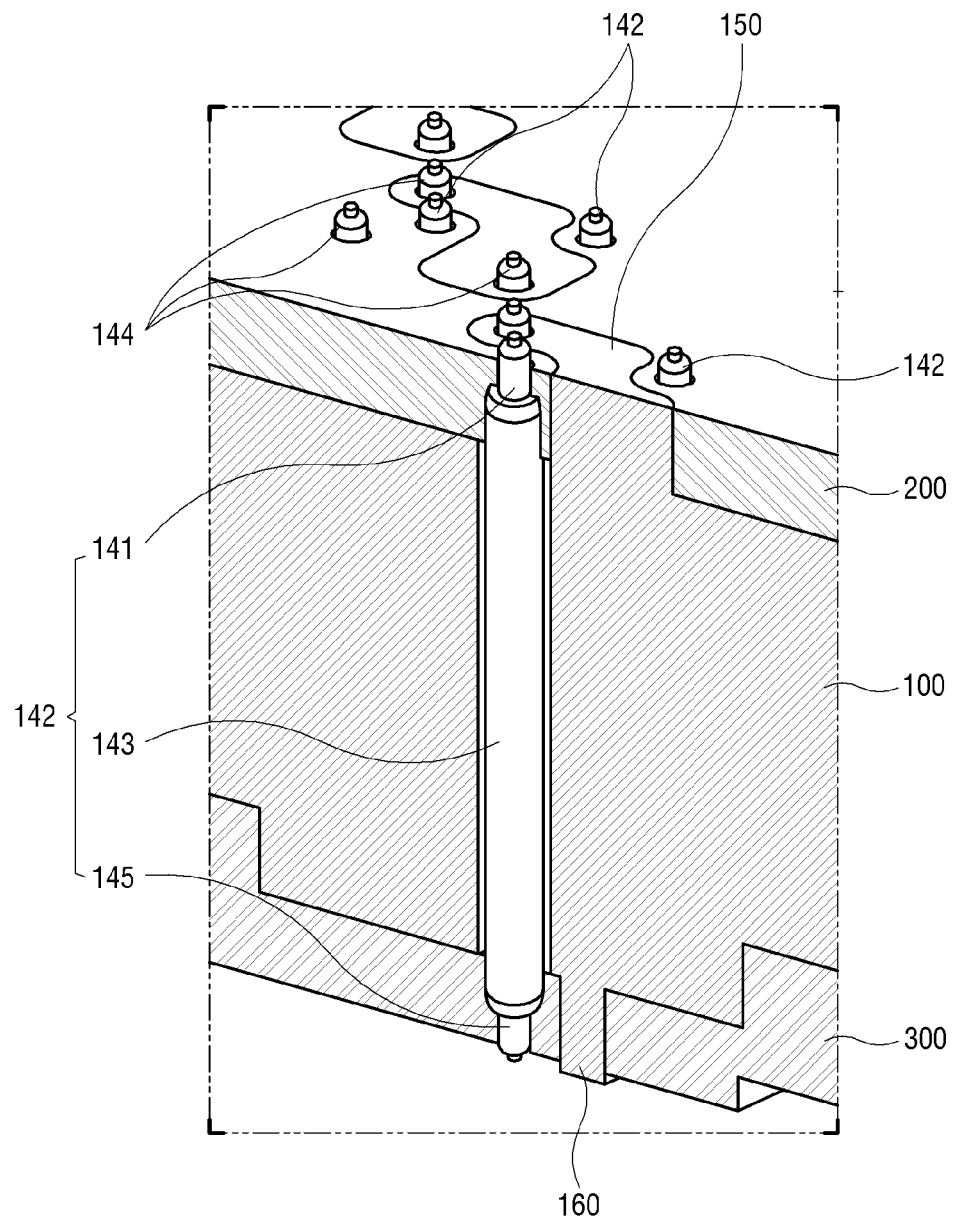
FIG. 5 is a partial cut-open perspective view of the probe socket according to the first embodiment of the present invention.

FIG. 3 is an exploded perspective view of a noise shielding body 100 in FIG. 1. The noise shielding body 100 is formed with a conductive brass block or by coating a nonconductive block with a conductive film. Opposite ends of signal probes 142 and ground probes 144 are exposed from the top and bottom sides of the noise shielding body 100. As shown in FIG. 5, the signal probe 142 includes an upper plunger 141 and a lower plunger 145 partially accommodated in the cylindrical barrel 143 and sliding within the barrel 143 towards each other without coming out of the barrel 143, and a spring (not shown) arranged between the upper plunger 141 and the lower plunger 145 within the barrel 143 and elastically moving at least one of the upper plunger 141 and the lower plunger 145. The ground probes 144 have the same or similar structure to the signal probe 142, and detailed descriptions thereof will be omitted. For the signal probes 142 or the ground probes 144, various probes may be applied.

The noise shielding body 100 is formed with signal probe holes 112 and ground probe holes 114. The plurality of signal probes 142 and the plurality of ground probes 144 are accommodated in the signal probe holes 112 and the ground probe holes 114 and parallel with each other while exposing the opposite ends thereof. In this case, the plurality of signal probes 142 do not have to be in contact with an inner wall of the signal probe hole 112 so as to prevent a short-circuit. In addition, the plurality of ground probes 144 are accommodated in the ground probe holes 114 and parallel with each other while being in contact with the inner wall of the ground probe holes 114.

On the top side of the noise shielding body 100, the upper portions of the plurality of signal probes 142 and the plurality of ground probes 144 are exposed as shown in FIG. 5. On the top side of the noise shielding body 100, an upper noise shielding wall 150 is formed and extended toward the predetermined areas between the exposed end portions of the plurality of signal probes 142. The upper noise shielding wall 150 includes upper portions of two ground probes 144. Of course, the upper noise shielding wall 150 may be designed not to include the upper portion of the ground probe 144.

The lower portions of the plurality of signal probes 142 and the plurality of ground probes 144 are exposed on the bottom side of the noise shielding body 100. On the bottom side of the noise shielding body 100, a lower noise shielding wall 160 is formed and extended toward the predetermined areas between the exposed end portions of the plurality of signal probes 142. Unlike the upper noise shielding wall 150, the lower noise shielding wall 160 does not accommodate the lower portions of the ground probes 144. Alternatively, the lower noise shielding wall 160 may be designed to accommodate the lower portion of the ground probe 144.

The upper holding member 200 is made of ceramic or the like nonconductive material, and holds and supports the signal probes 142 and the ground probes 144. The upper holding member 200 includes an upper shielding body accommodating groove 211 to accommodate a partial upper portion of the noise shielding body 100, an upper shielding wall accommodating groove 250 to accommodate the upper noise shielding wall 150 of the noise shielding body 100, a signal probe upper holding hole 242 to accommodate an upper portion of the signal probe 142 protruding from the top of the noise shielding body 100, and a ground probe upper holding hole 244 to accommodate the ground probes 144 protruding from the top of the noise shielding body 100.

The upper shielding wall accommodating groove 250 is formed to penetrate the upper holding member 200. Of course, the upper shielding wall accommodating groove 250 may be formed not to penetrate the upper holding member 200. The signal probe upper holding hole 242 is extended from the bottom of the upper holding member 200 while having a size suitable for receiving the barrel 143, and is narrowed to have a size suitable for receiving the upper plunger 141. Therefore, the upper plunger 141 of the signal probe 142 is only partially exposed on the top of the probe socket 1. Likewise, the ground probe upper holding hole 244 is extended from the bottom of the upper holding member 200 while having a size suitable for receiving the barrel 143 of the ground probe, and is narrowed to have a size suitable for receiving the upper plunger of the ground probe. Therefore, the upper plunger of the ground probe 144 is only partially exposed on the top of the probe socket 1.

As shown in FIG. 5, the conductive upper noise shielding wall 150 is interposed between two signal probes 142 at the upper holding member 200, thereby preventing crosstalk between the signal probes 142. Further, the conductive upper noise shielding wall 150 and the upper shielding wall accommodating groove 250 of the upper holding member 200 are precisely manufactured so that the upper portions of the plurality of signal probes 142 and ground probes 144 can be accurately aligned with and coupled to the signal probe upper holding hole 242 and ground probe upper holding hole 244 of the upper holding member 200.

The lower holding member 300 is made of ceramic or the like nonconductive material, and holds and supports the signal probes 142 and the ground probes 144. The lower holding member 300 includes a lower shielding body accommodating groove 311 to accommodate a partial lower portion of the noise shielding body 100, a lower shielding wall accommodating groove 360 to accommodate the lower noise shielding wall 160 of the noise shielding body 100, a signal probe lower holding hole 342 to accommodate a lower portion of the signal probe 142 protruding from the bottom of the noise shielding body 100, and a ground probe lower holding hole 344 to accommodate the ground probes 144 protruding from the bottom of the noise shielding body 100.

The lower shielding wall accommodating groove 360 is formed to penetrate the lower holding member 300. Of course, the lower shielding wall accommodating groove 360 may be formed not to penetrate the lower holding member 300. The signal probe lower holding hole 342 is extended to the bottom of the lower holding member 300 while having a size suitable for receiving the barrel 143, and is narrowed to have a size suitable for receiving the lower plunger 145. Therefore, the lower plunger 145 of the signal probe 142 is only partially exposed on the bottom of the probe socket 1. Likewise, the ground probe lower holding hole 344 is extended from the top of the lower holding member 300 while having a size suitable for receiving the barrel of the ground probe, and is narrowed to have a size suitable for receiving the lower plunger of the ground probe. Therefore, the lower plunger of the ground probe 144 is only partially exposed on the bottom of the probe socket 1.

As shown in FIG. 5, the conductive lower noise shielding wall 160 is interposed between two signal probes 142 at the lower holding member 300, thereby preventing crosstalk between the signal probes 142. Further, the conductive lower noise shielding wall 160 and the lower shielding wall accommodating groove 350 of the lower holding member 300 are precisely manufactured so that the lower portions of the plurality of signal probes 142 and ground probes 144 can be accurately aligned with and coupled to the signal probe lower holding hole 342 and ground probe lower holding hole 344 of the lower holding member 200.

The reference numerals of '118' and '218' indicate alignment holes for aligning the upper holding member 200, the noise shielding body 100, and the lower holding member 300 with one another, and the reference numerals of '216' and '316' are alignment holes for aligning the assembled probe socket 1 and a support frame (not shown) of the test device with each other.

Figure 4:
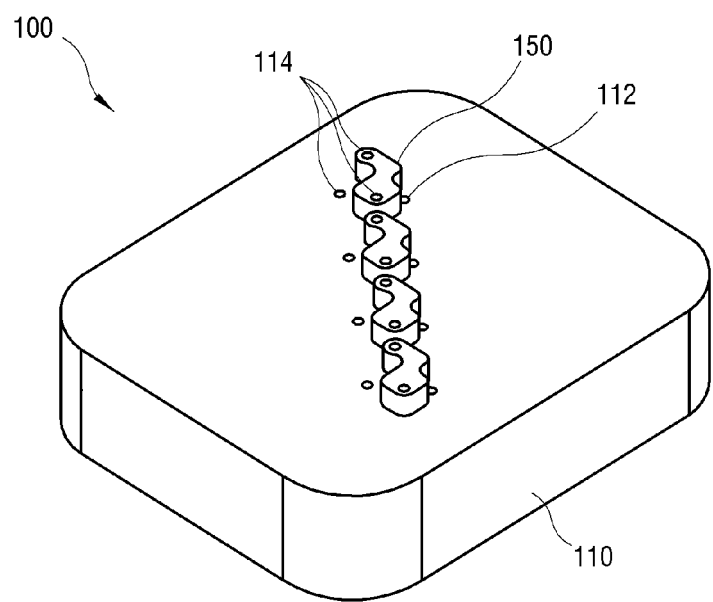
FIG. 4 is a perspective view of the noise shielding body in FIG. 3
Figure 6:
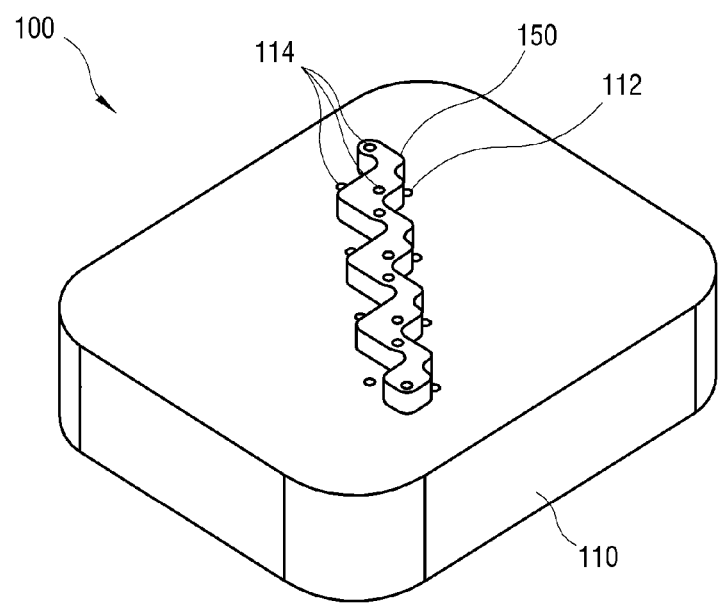
FIG. 6 is a perspective view of a noise shielding body according to a second embodiment of the present invention.

FIG. 6 is a perspective view of a noise shielding body according to a second embodiment of the present invention. As shown in FIG. 6, the noise shielding body 100 according to the second embodiment may include an upper noise shielding wall 150 and a lower noise shielding wall (not shown), each of which is continuously connected as a single body, unlike the island-type noise shielding walls 150 as shown in FIG. 4.

Figure 7:
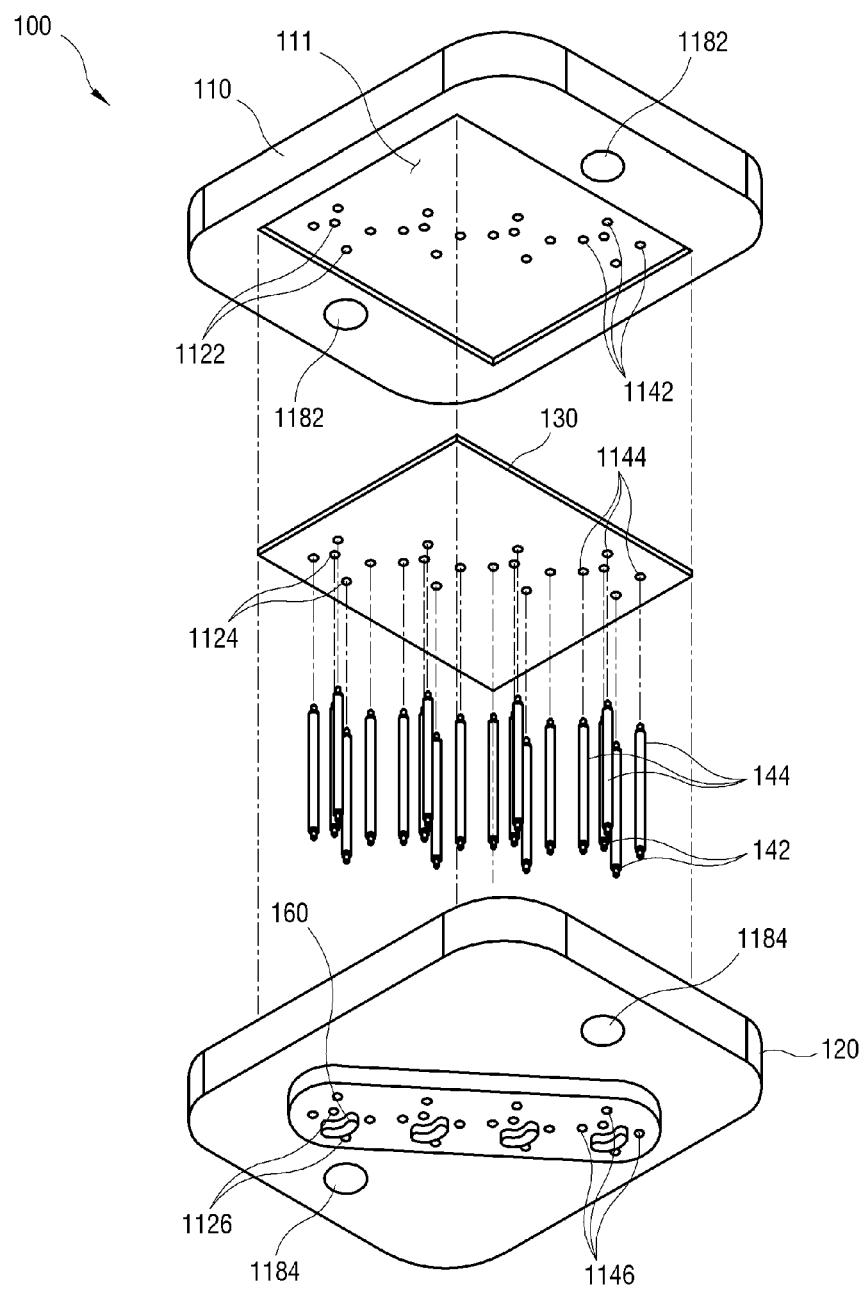
FIG. 7 is an exploded perspective view of a noise shielding body according to the third embodiment of the present invention.

FIG. 7 is an exploded perspective view of a noise shielding body according to the third embodiment of the present invention. The noise shielding body 100 may include an upper shielding body 110 and a lower shielding body 120, and may also be designed to include three or more shielding bodies. A nonconductive supporting member 130 is interposed between the upper shielding body 110 and the lower shielding body 120. When the noise shielding body 100 includes three or more shielding bodies, a plurality of supporting members may be applied.

The upper shielding body 110 and the lower shielding body 120 may be formed with the signal probe holes 1122 and 1126, and the ground probe holes 1142 and 1146 as shown in FIG. 7. In this case, the plurality of signal probes 142 are not in contact with the inner wall of the signal probe hole 1122 and 1126 so as to prevent a short circuit. To secure this contactless structure, the supporting member 130 is interposed between the upper shielding body 110 and the lower shielding body 120. Meanwhile, the plurality of ground probes 144 are accommodated to be in contact with the inner walls of the ground probe holes 114 and 124 and parallel with one another.

In this specification, the present invention and the merits thereof are described with reference to the exemplary embodiments. However, it will be appreciated by a person having an ordinary skill in the art that various modifications and changes can be made without departing from the scope of the present invention disclosed in the following appended claims. Accordingly, the specification and the drawings are only for illustrative purposes and not construed as limiting the present invention. All these possible modifications have to be made within the scope of the present invention.

A probe socket according to the present invention is applicable to testing electric characteristics of a semiconductor in a process of manufacturing the semiconductor.

What is claimed is:

1. A probe socket with a plurality of signal probes for testing electric characteristics of an object, the probe socket comprising:
    a conductive noise shielding body configured to accommodate the plurality of signal probes therein to be parallel with one another while exposing opposite ends of the signal probes from the conductive noise shielding body, and shield noise between the plurality of signal probes;
    upper and lower conductive noise shielding walls respectively protruded from upper and lower surfaces of the noise shielding body to a predetermined height and extended laterally to block a predetermined area between the exposed opposite ends of the plurality of signal probes; and
    upper and lower holding members respectively coupled to top and bottom sides of the noise shielding body, and configured to support the exposed opposite ends of the plurality of signal probes, and comprising noise shielding walls accommodating grooves for accommodating the conductive noise shielding walls thereto, respectively,
    wherein the upper and lower holding members each comprises signal probe holding holes configured to hold the signal probes protruded from the upper and lower surfaces of the noise shielding body at predetermined locations.

2. The probe socket according to claim 1, wherein the noise shielding walls accommodating grooves are configured to penetrate the upper and lower holding members.

3. The probe socket according to claim 1, wherein the noise shielding body comprises a brass block.

4. The probe socket according to claim 1, wherein the noise shielding body comprises at least two noise shielding bodies to be stacked, and
    the probe socket further comprises an intermediate supporting member configured to support the plurality of signal probes between the stacked noise shielding bodies.

5. The probe socket according to claim 1, further comprising a plurality of ground probes,
    wherein the upper and lower conductive noise shielding walls each includes a least one ground probe holding hole to accommodate at least one of the plurality of ground probes there-through.

* * * * *